United States Patent
Yamaguchi

(10) Patent No.: US 12,199,410 B2
(45) Date of Patent: Jan. 14, 2025

(54) SEMICONDUCTOR DEVICE AND METHOD FOR PRODUCING THE SAME

(71) Applicant: Mitsubishi Electric Corporation, Tokyo (JP)

(72) Inventor: Tsutomu Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 540 days.

(21) Appl. No.: 17/632,766

(22) PCT Filed: Feb. 6, 2020

(86) PCT No.: PCT/JP2020/004620
§ 371 (c)(1),
(2) Date: Feb. 3, 2022

(87) PCT Pub. No.: WO2021/157027
PCT Pub. Date: Aug. 12, 2021

(65) Prior Publication Data
US 2022/0278507 A1    Sep. 1, 2022

(51) Int. Cl.
*H01S 5/227* (2006.01)
*H01L 21/28* (2006.01)
*H01S 5/042* (2006.01)
*H01S 5/343* (2006.01)

(52) U.S. Cl.
CPC ...... *H01S 5/2275* (2013.01); *H01L 21/28017* (2013.01); *H01S 5/0421* (2013.01); *H01S 5/343* (2013.01)

(58) Field of Classification Search
CPC .............. H01L 21/28017; H01S 5/34373
See application file for complete search history.

(56) References Cited

U.S. PATENT DOCUMENTS

| 9,280,030 B2 * | 3/2016 | Kimura ............ G02F 1/2257 |
| 2009/0268773 A1 * | 10/2009 | Iwai ............... B82Y 20/00 |
| | | 257/E33.002 |

FOREIGN PATENT DOCUMENTS

| JP | H08-316579 A | 11/1996 |
| JP | H11-054843 A | 2/1999 |
| JP | 2000-091700 A | 3/2000 |
| JP | 2000-208628 A | 7/2000 |
| JP | 2004-319912 A | 11/2004 |
| JP | 2007-173392 A | 7/2007 |
| JP | 2010-219261 A | 9/2010 |

OTHER PUBLICATIONS

International Search Report issued in PCT/JP2020/004620; mailed Apr. 7, 2020.
Ivey, D.G. et al., Galvanic Corrosion Effects in InP-Based Laser Ridge Structures, Journal of Electronic Materials, Feb. 1998, vol. 27, No. 2, pp. 89-95.

* cited by examiner

*Primary Examiner* — Tuan N Nguyen
(74) *Attorney, Agent, or Firm* — Studebaker & Brackett PC

(57) ABSTRACT

An insulating film (10) having an opening (11) is formed on a contact layer (7). A shape stabilization layer (8) having an inclined surface (9) is formed on the contact layer (7) in a peripheral portion of the opening (11). An underlying metal (12) covers an upper surface of the contact layer (7) exposed through the opening (11) and the inclined surface (9). A plating (13) is formed on the underlying metal (12).

6 Claims, 7 Drawing Sheets

US 12,199,410 B2

SEMICONDUCTOR DEVICE AND METHOD FOR PRODUCING THE SAME

FIELD

The present disclosure relates to a semiconductor device in which a shape of a contact portion is stabilized and a method for producing the same.

BACKGROUND

In a semiconductor device, an InGaAs layer is used as a contact layer that contacts an electrode. It is known that the InGaAs layer is corroded when there is a gap in metallization on the InGaAs layer (see, e.g., Non Patent Literature 1).

CITATION LIST

Non Patent Literature

[Non Patent Literature 1] "Journal of Electronic Materials", February 1998, Volume 27, Issue 2, pp 89-95

SUMMARY

Technical Problem

A contact layer is exposed through an opening of an insulating film. An underlying metal is formed on the exposed contact layer. An inner wall of the opening of the insulating film and an upper surface of the contact layer are perpendicular to each other. Thus, a coating is interrupted in a peripheral portion of the opening of the insulating film so that a clearance may be left. A plating solution enters the insulating film from the clearance when an Au plating is formed, and the contact layer is etched in the peripheral portion of the opening. This has resulted in a problem that a shape of a contact portion is not stabilized.

The present disclosure has been made to solve the above-described problem, and is directed to obtaining a semiconductor device in which a shape of a contact portion is stabilized and a method for producing the same.

Solution to Problem

A semiconductor device according to the present disclosure includes: a contact layer; an insulating film formed on the contact layer and having an opening; a shape stabilization layer having an inclined surface formed on the contact layer in a peripheral portion of the opening; an underlying metal covering an upper surface of the contact layer exposed through the opening and the inclined surface; and a plating formed on the underlying metal.

Advantageous Effects of Invention

In the present disclosure, the shape stabilization layer having the inclined surface is formed on the contact layer in the peripheral portion of the opening. The underlying metal covers the upper surface of the contact layer exposed through the opening and the inclined surface. A coverage of the underlying metal is improved by the inclined surface. Thus, a coating is not interrupted in the peripheral portion of the opening of the insulating film. Therefore, the contact layer is not etched with a plating solution when the plating is formed. Accordingly, a semiconductor device in which a shape of a contact portion is stabilized can be obtained.

DESCRIPTION OF EMBODIMENTS

A semiconductor device and a method for producing the same according to the embodiments of the present disclosure will be described with reference to the drawings. The same components will be denoted by the same symbols, and the repeated description thereof may be omitted.

Embodiment 1

Figure 1:
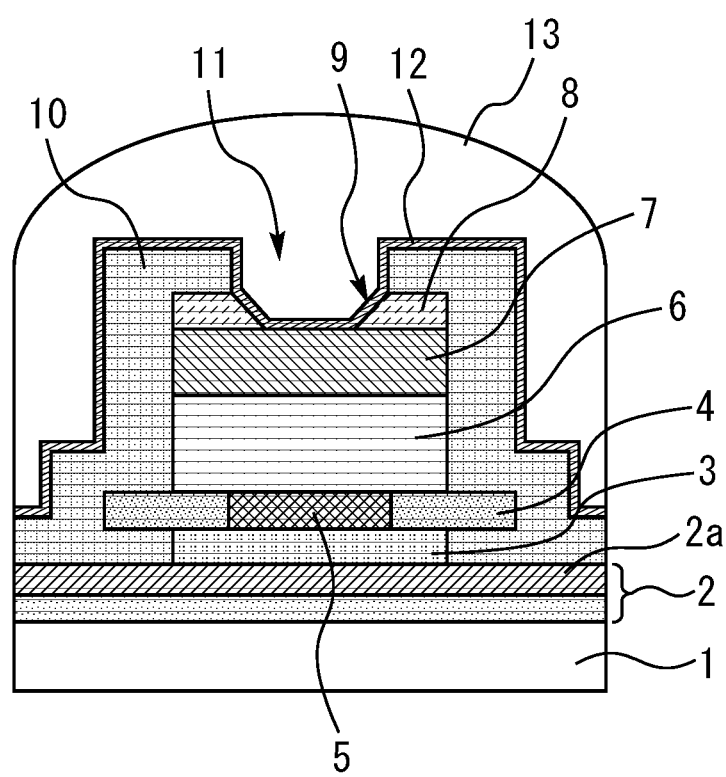
FIG. 1 is a cross-sectional view illustrating a semiconductor device according to an embodiment 1.

FIG. 1 is a cross-sectional view illustrating a semiconductor device according to an embodiment 1. The semiconductor device is a ridge-type laser diode. An InGaAsP-based active layer 2 having a multiple quantum well structure is formed on an n-type InP substrate 1. An InP ridge lower layer 3 and an InGaAsP layer 4 are formed in this order on an outermost surface layer 2a in the active layer 2. A thin InP layer may be formed as a cap layer on the InGaAsP layer 4.

A diffraction grating 5 is embedded in a central portion of the InGaAsP layer 4. An InP ridge upper layer 6 and an InGaAs contact layer 7 are formed in this order on the InGaAsP layer 4 and the diffraction grating 5. A shape stabilization layer 8 having a film thickness of 30 nm to 100 nm is formed on the InGaAs contact layer 7. The shape stabilization layer 8 has an opening in its central portion, and an inner wall of the opening is an inclined surface 9. An angle of the inclined surface 9 with respect to an upper surface of the InGaAs contact layer 7 is 30° to 80°. The inclined surface 9 has such a tapered shape that the shape stabilization layer 8 has a film thickness gradually decreasing toward the central portion from its peripheral portion.

The InP ridge lower layer 3, the InGaAsP layer 4, the InP ridge upper layer 6, the InGaAs contact layer 7, and the shape stabilization layer 8 constitute a ridge structure. An insulating film 10 is formed on the InGaAs contact layer 7 and the shape stabilization layer 8, and covers a side surface of the ridge structure. The insulating film 10 is a $SiO_2$ film. The insulating film 10 has an opening 11. The inclined surface 9 of the shape stabilization layer 8 is formed on the InGaAs contact layer 7 in a peripheral portion of the opening 11. An upper end of the inclined surface 9 is connected to an inner wall of the opening 11 of the insulating film 10, and a lower end of the inclined surface 9 is connected to the InGaAs contact 7. Due to the existence of the inclined surface 9, a lower end portion on the periphery of the opening 11 is smoothed. An underlying metal 12 covers the upper surface of the InGaAs contact layer 7 exposed through the opening 11 and the inclined surface 9. An Au plating 13 is formed on the underlying metal 12.

Figure 2:
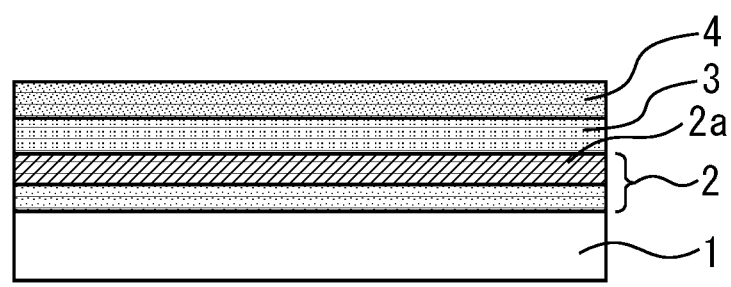
FIG. 2 is a cross-sectional view illustrating a method for producing the semiconductor device according to the embodiment 1.
Figure 3:
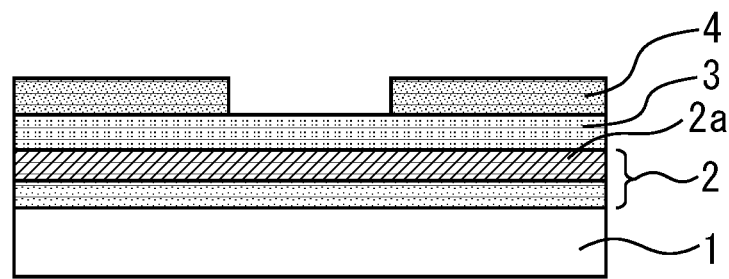
FIG. 3 is a cross-sectional view illustrating a method for producing the semiconductor device according to the embodiment 1.
Figure 4:
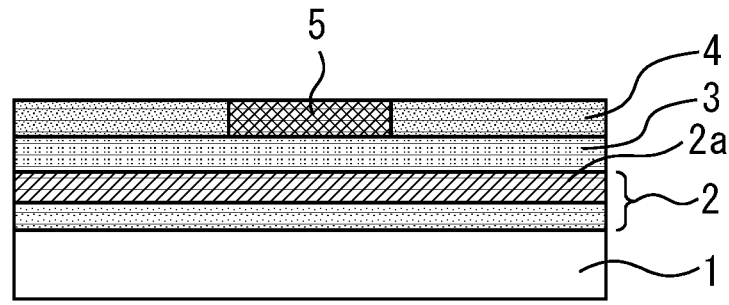
FIG. 4 is a cross-sectional view illustrating a method for producing the semiconductor device according to the embodiment 1.
Figure 5:
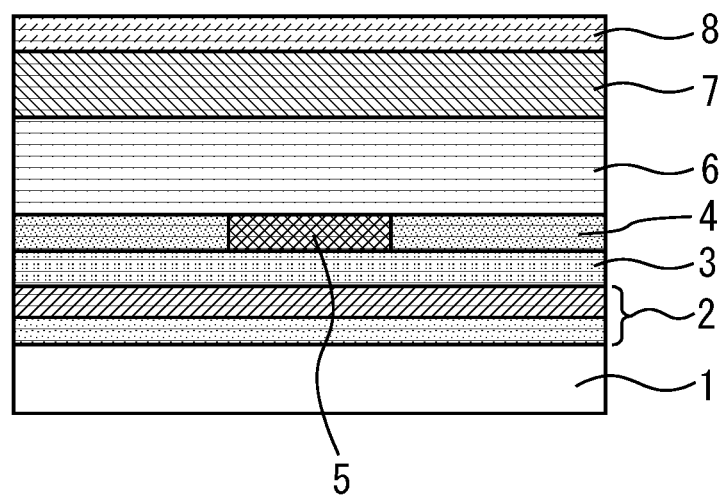
FIG. 5 is a cross-sectional view illustrating a method for producing the semiconductor device according to the embodiment 1.

FIGS. 2 to 10 are cross-sectional views illustrating a method for producing the semiconductor device according to the embodiment 1. First, an active layer 2, an InP ridge lower layer 3, and an InGaAsP layer 4 are formed in this order on an n-type InP substrate 1, as illustrated in FIG. 2. Then, a central portion of the InGaAsP layer 4 is removed, as illustrated in FIG. 3. Then, InP is embedded in a removed portion and grown, to form a diffraction grating 5, as illustrated in FIG. 4. Then, an InP ridge upper layer 6, an InGaAs contact layer 7, and a shape stabilization layer 8 are formed in this order on the InGaAsP layer 4 and the diffraction grating 5, as illustrated in FIG. 5.

Figure 6:
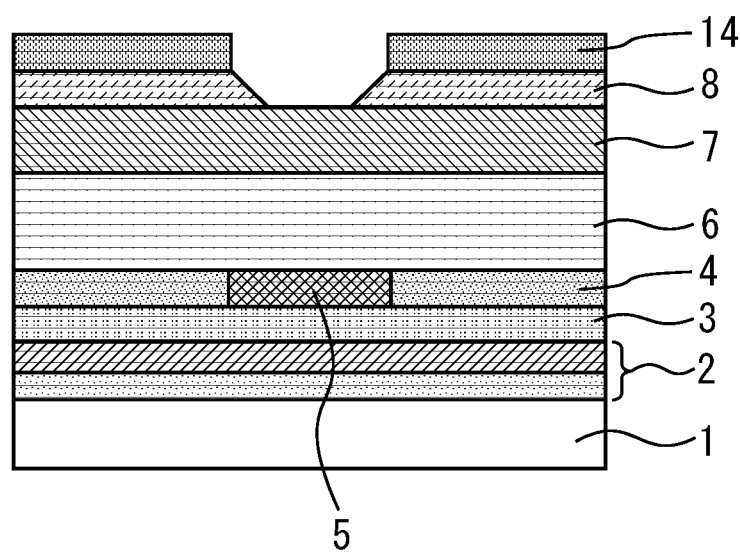
FIG. 6 is a cross-sectional view illustrating a method for producing the semiconductor device according to the embodiment 1.

Then, a mask 14 composed of a photoresist or an insulating film is formed on the shape stabilization layer 8, as illustrated in FIG. 6. An opening is formed in a central portion of the mask 14 by photolithography or the like. A central portion of the shape stabilization layer 8 is wet etched with a wet etchant containing a hydrochloric acid, a phosphoric acid, and the like using the mask 14, to expose a part of an upper surface of the InGaAs contact layer 7. At the time of the wet etching, an inclined surface 9 is formed on an inner wall of an opening of the shape stabilization layer 8. The shape stabilization layer 8 is composed of a material different from the InGaAs contact layer 7, e.g., AlGaInP or InP. Accordingly, the shape stabilization layer 8 is selectively wet etched with respect to the InGaAs contact layer 7. Then, the mask 14 is removed.

Figure 7:
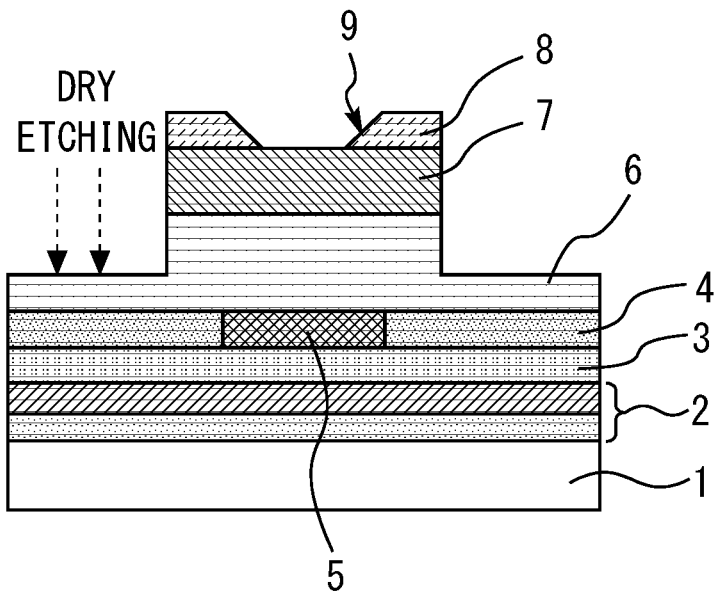
FIG. 7 is a cross-sectional view illustrating a method for producing the semiconductor device according to the embodiment 1.

Then, dry etching is performed using an insulating film hard mask or the like composed of $SiO_2$ or the like, to form a ridge structure, as illustrated in FIG. 7. The width of the ridge structure is set to a desired width required for a characteristic. In this stage, the etching is not performed up to the InGaAsP layer 4, leaving a part of the InP ridge upper layer 6.

Figure 8:
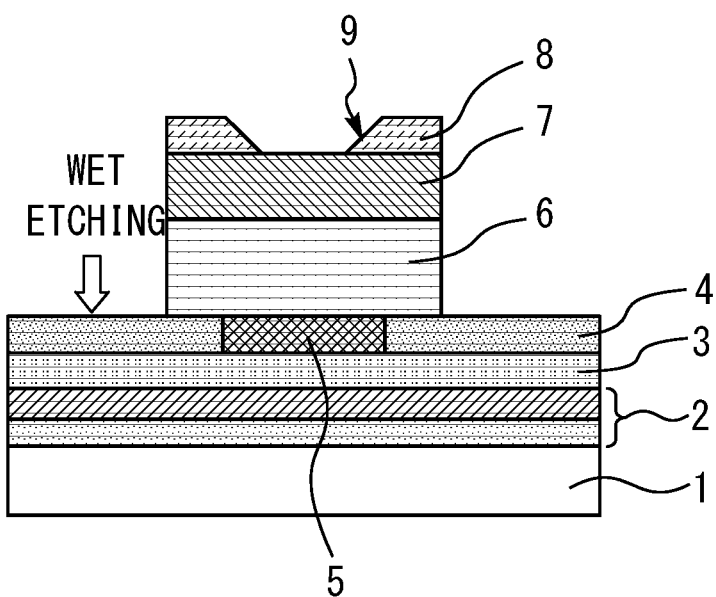
FIG. 8 is a cross-sectional view illustrating a method for producing the semiconductor device according to the embodiment 1.

Then, the remaining InP ridge upper layer 6 is wet etched to expose the InGaAsP layer 4, as illustrated in FIG. 8. When a wet etchant having a sufficiently large etching selection ratio between the InGaAsP layer 4 and the InP ridge upper layer 6 is used, a ridge processing accuracy increases.

Figure 9:
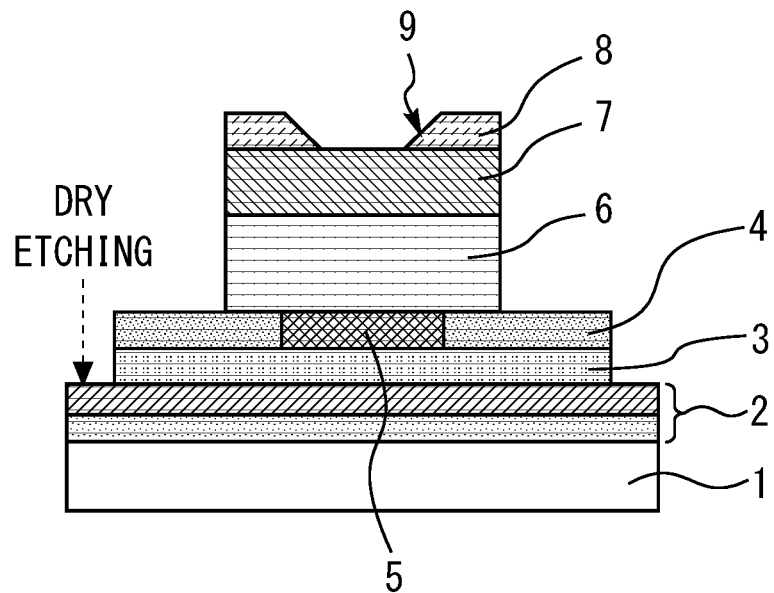
FIG. 9 is a cross-sectional view illustrating a method for producing the semiconductor device according to the embodiment 1.
Figure 10:
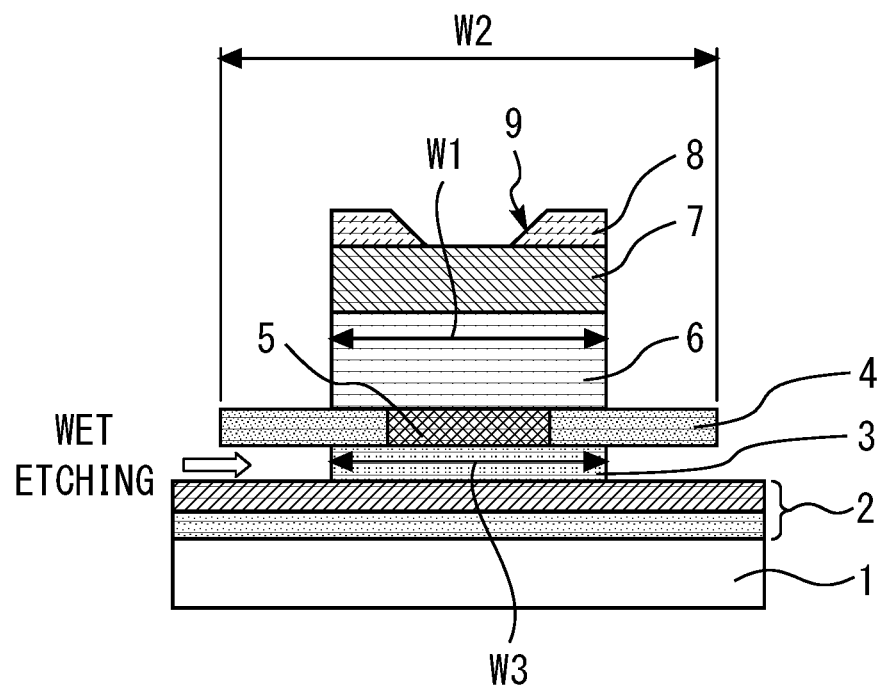
FIG. 10 is a cross-sectional view illustrating a method for producing the semiconductor device according to the embodiment 1.

Then, the InGaAsP layer 4 and the InP ridge lower layer 3 are dry etched, as illustrated in FIG. 9. Then, a side etching effect of wet etching is used, to etch the InP ridge lower layer 3 from the side such that a width W3 of the InP ridge lower layer 3 relative to a width W1 of the InP ridge upper layer 6 and a width W2 of the InGaAsP layer 4 has a desired value, as illustrated in FIG. 10. When a wet etchant having a sufficiently large etching selection ratio of the InP ridge lower layer 3 to the InGaAsP layer 4 is used, a ridge processing accuracy increases. After the ridge structure is formed, the above-described wet etching of the shape stabilization layer 8 may be performed.

Then, an insulating film 10 is formed using a film formation method such as a plasma CVD method to cover respective tops of the InGaAs contact layer 7 and the shape stabilization layer 8 and a side surface of the ridge structure. The insulating film 10 above a central portion of the InGaAs contact layer 7 is removed, to form an opening 11. An underlying metal 12 is formed by sputtering or evaporation, to cover the entire ridge structure including the upper surface of the InGaAs contact layer 7 exposed through the opening 11 and the inclined surface 9. There is no problem even if the underlying metal 12 is formed on an entire surface of the insulating film 10.

Then, when the entire device is immersed in a plating solution to perform electrolytic plating, Au is deposited on the underlying metal 12 by electrochemical reaction. As a result, an Au plating 13 is formed on the underlying metal 12. Through the foregoing processes, the semiconductor device illustrated in FIG. 1 is produced.

Figure 11:
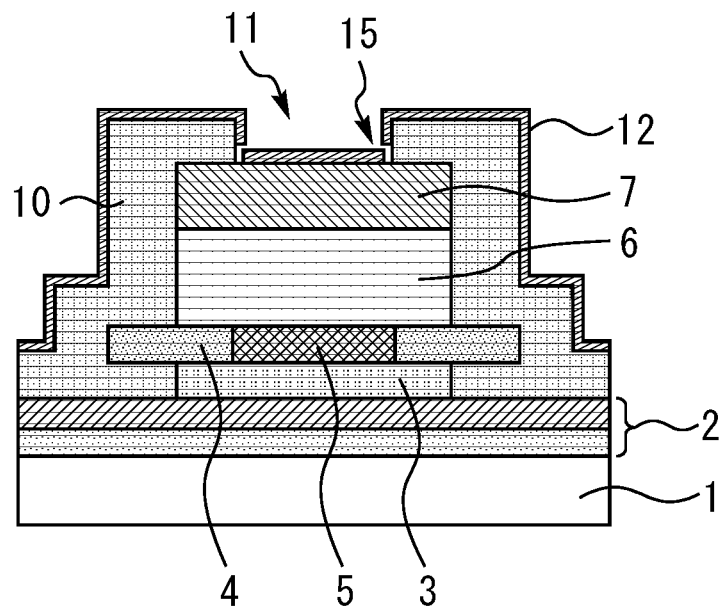
FIG. 11 is a cross-sectional view illustrating a state where plating has not yet been performed in a semiconductor device according to a comparative example.

FIG. 11 is a cross-sectional view illustrating a state where plating has not yet been performed in a semiconductor device according to a comparative example. In the comparative example, a shape stabilization layer 8 does not exist, and an inner wall of an opening 11 of an insulating film 10 and an upper surface of an InGaAs contact layer 7 are perpendicular to each other. Accordingly, a coverage of an underlying metal 12 is insufficient, and a coating is interrupted in a peripheral portion of the opening 11 of the insulating film 10 so that a clearance 15 may be left. A plating solution enters the insulating film 10 from the clearance 15 when an Au plating 13 is formed. Electrochemical reaction occurs in the peripheral portion of the opening 11 in which a current locally becomes excessive so that the InGaAs contact layer 7 is etched. As a result, a shape of a contact portion is not stabilized.

On the other hand, in the present embodiment, the shape stabilization layer 8 having the inclined surface 9 is formed on the InGaAs contact layer 7 in the peripheral portion of the opening 11. The underlying metal 12 covers the upper surface of the InGaAs contact layer 7 exposed through the opening 11 and the inclined surface 9. A coverage of the underlying metal 12 is improved by the inclined surface 9. Thus, a coating is not interrupted in the peripheral portion of the opening 11 of the insulating film 10. Therefore, the InGaAs contact layer 7 is not etched with a plating solution when the Au plating 13 is formed. Accordingly, a semiconductor device in which a shape of a contact portion is stabilized can be obtained.

The shape stabilization layer 8 may be composed of an insulator such as SiN or $SiO_2$. In this case, the inclined surface 9 can be formed by adjusting an etching condition obtained when the insulator is processed. Specifically, when the insulator is processed using RIE (reactive ion etching) or ICP (inductively coupled plasma), processing proceeds in a balance between chemical reaction etching with a reaction gas and adhesion of a reaction product. When a bias condition and a flow rate of an etching gas are adjusted such that adhesion of the reaction product to a side wall of a processing portion increases, the inclined surface 9 of the shape stabilization layer 8 can be formed.

Even if an etching condition, a film type, and a film formation condition are adjusted, an etching selection ratio between the insulating film 10 and the insulator composing the shape stabilization layer 8 cannot be set to 1:0. Accordingly, when the opening 11 of the insulating film 10 is formed, the insulator composing the shape stabilization layer 8 is slightly etched.

Figure 12:
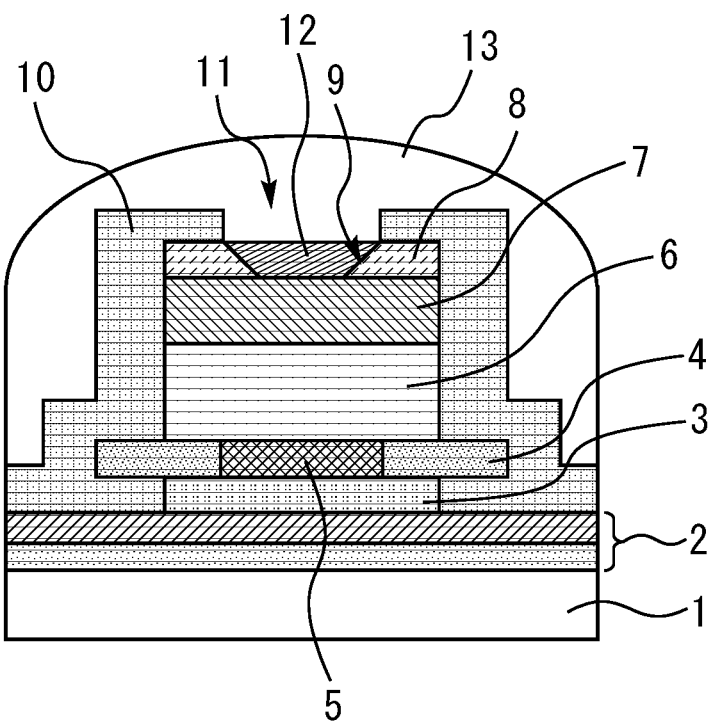
FIG. 12 is a cross-sectional view illustrating a modification of the semiconductor device according to the embodiment 1.

FIG. 12 is a cross-sectional view illustrating a modification of the semiconductor device according to the embodiment 1. Although the underlying metal 12 is also formed on the insulating film 10 in FIG. 1, an underlying metal 12 is not formed on an insulating film 10 in FIG. 12. In this case, a semiconductor device in which a shape of a contact portion is stabilized can also similarly be obtained.

A configuration according to the present disclosure is not limited to a ridge-type laser diode, but is also applicable to an embedded laser diode and is also applicable to a ridge-type laser diode having a structure of their combination.

Embodiment 2

Figure 13:
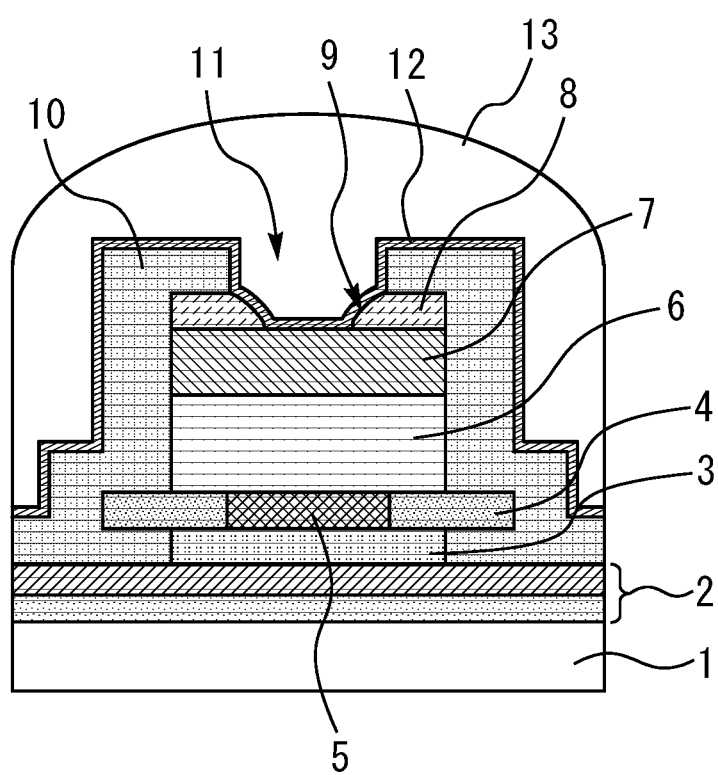
FIG. 13 is a cross-sectional view illustrating a semiconductor device according to an embodiment 2.

FIG. 13 is a cross-sectional view illustrating a semiconductor device according to an embodiment 2. In the present embodiment, a shape stabilization layer 8 composed of AlGaInP, InP, or the like is left in a time period of approximately 10 min to 30 min in the vicinity of a crystal growth temperature of MOCVD or the like of 600° C. to 650° C. to perform heating processing. As a result, the inclined surface 9 has a curved surface by a mass transport having a shape changing such that a surface energy decreases. In this case, a semiconductor device in which a shape of a contact portion is stabilized can also be obtained, like in the embodiment 1.

REFERENCE SIGNS LIST

7 InGaAs contact layer; 8 shape stabilization layer; 9 inclined surface; 10 insulating film; 11 opening; 12 underlying metal; 13 Au plating

The invention claimed is:
1. A semiconductor device comprising:
a contact layer;
an insulating film formed on the contact layer and having an opening;
a shape stabilization layer having an inclined surface formed on the contact layer in a peripheral portion of the opening;
an underlying metal covering an upper surface of the contact layer exposed through the opening and the inclined surface; and
a plating formed on the underlying metal,
wherein a material of the shape stabilization layer is different from a material of the contact layer, and
the material of the shape stabilization layer is a semiconductor.
2. The semiconductor device according to claim 1, wherein the contact layer is an InGaAs layer.
3. The semiconductor device according to claim 1, wherein the inclined surface has a curved surface.
4. A method for producing a semiconductor device comprising:
forming a shape stabilization layer on a contact layer;
etching the shape stabilization layer to form an inclined surface and to expose a part of an upper surface of the contact layer;
forming an insulating film on the shape stabilization layer;
forming an opening in the insulating film;
forming an underlying metal covering an upper surface of the contact layer exposed through the opening and the inclined surface; and
forming a plating on the underlying metal by electrolytic plating,
wherein the inclined surface is formed in a peripheral portion of the opening,
a material of the shape stabilization layer is different from a material of the contact layer,
the shape stabilization layer is selectively etched with respect to the contact layer when forming the inclined surface, and
the material of the shape stabilization layer is a semiconductor, and
the shape stabilization layer is wet etched to form the inclined surface.
5. The method for producing a semiconductor device according to claim 4, wherein the contact layer is an InGaAs layer.
6. The method for producing a semiconductor device according to claim 4, further comprising making the inclined surface a curved surface by a mass transport.

* * * * *